United States Patent
Chen et al.

(10) Patent No.: US 10,236,195 B1
(45) Date of Patent: *Mar. 19, 2019

(54) METHOD FOR TRANSFERRING DEVICE

(71) Applicant: MIKRO MESA TECHNOLOGY CO., LTD., Apia (WS)

(72) Inventors: Li-Yi Chen, Tainan (TW); Shih-Chyn Lin, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

This patent is subject to a terminal disclaimer.

(21) Appl. No.: 15/847,942

(22) Filed: Dec. 20, 2017

(51) Int. Cl.
- *H01L 21/67* (2006.01)
- *H01L 21/683* (2006.01)
- *H01L 21/78* (2006.01)
- *H01L 25/075* (2006.01)

(52) U.S. Cl.
CPC .... *H01L 21/67144* (2013.01); *H01L 21/6833* (2013.01); *H01L 21/6835* (2013.01); *H01L 21/78* (2013.01); *H01L 25/0753* (2013.01); *H01L 2221/68327* (2013.01); *H01L 2221/68381* (2013.01)

(58) Field of Classification Search
CPC ................................................. H01L 21/67144
See application file for complete search history.

(56) References Cited

U.S. PATENT DOCUMENTS

| | | | |
|---|---|---|---|
| 7,163,597 B2 | 1/2007 | Murata et al. | |
| 8,333,860 B1 | 12/2012 | Bibl et al. | |
| 8,349,116 B1* | 1/2013 | Bibl | H01L 21/67144 156/249 |
| 8,518,204 B2 | 8/2013 | Hu et al. | |
| 8,558,243 B2 | 10/2013 | Bibl et al. | |
| 8,794,501 B2 | 8/2014 | Bibl et al. | |
| 8,809,875 B2 | 8/2014 | Bibl et al. | |
| 9,722,134 B1* | 8/2017 | Chen | H01L 33/005 |
| 2004/0168764 A1 | 9/2004 | Anker | |
| 2007/0000595 A1 | 1/2007 | Prack | |
| 2007/0037364 A1 | 2/2007 | Sugita et al. | |
| 2008/0122119 A1 | 5/2008 | Kian et al. | |
| 2010/0317132 A1 | 12/2010 | Rogers et al. | |
| 2012/0299147 A1 | 11/2012 | Mitani et al. | |
| 2014/0084240 A1 | 3/2014 | Hu et al. | |
| 2016/0300745 A1* | 10/2016 | Chang | H01L 25/0753 |
| 2018/0226287 A1* | 8/2018 | Bower | H01L 21/6835 |

FOREIGN PATENT DOCUMENTS

TW    201332140 A1    8/2013

* cited by examiner

*Primary Examiner* — William Coleman
(74) *Attorney, Agent, or Firm* — CKC & Partners Co., LLC (57) ABSTRACT

A method for transferring a device includes the following steps: forming a pliable adhesive layer on a carrier substrate; placing the device over the pliable adhesive layer; contacting a transfer head assembly with the device, in which a pliable dielectric layer of the transfer head assembly is in contact with the device during the contacting and more pliable than the device, such that the pliable dielectric layer of the transfer head assembly deforms during the contacting, and the pliable adhesive layer is more pliable than the device, such that the pliable adhesive layer deforms during the contacting; actuating the transfer head assembly to create a grip force; picking up the device by the grip force created by the transfer head assembly; and placing the device onto a receiving substrate.

19 Claims, 7 Drawing Sheets

METHOD FOR TRANSFERRING DEVICE

BACKGROUND

Technical Field

The present disclosure relates to a method for transferring at least one device.

Description of Related Art

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing, a transfer wafer may pick up an array of devices from a donor wafer, and then bond the array of devices to a receiving wafer, followed by removal of the transfer wafer.

SUMMARY

According to one embodiment of the disclosure, a method for transferring at least one device includes the following steps: forming a pliable adhesive layer on a carrier substrate; placing the device over the pliable adhesive layer; contacting a transfer head assembly with the device, in which a pliable dielectric layer of the transfer head assembly is in contact with the device during the contacting and more pliable than the device, and the pliable adhesive layer is more pliable than the device; actuating the transfer head assembly to create a grip force on the device; picking up the device by the transfer head assembly; and placing the device onto a receiving substrate.

According to the method for transferring at least one device provided in the disclosure, since the pliable dielectric layer and the pliable adhesive layer deform when the transfer head assembly contacts the devices, the devices are leveled with the transfer head assembly. In this way, the gap between the devices and the transfer head assembly can be eliminated, such that the devices can be fully contacted with the transfer head assembly to maintain the grip force of the transfer head assembly. Therefore, it makes the transfer head assembly easier to pick up the devices, and increases the successful rate of picking up.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1A:
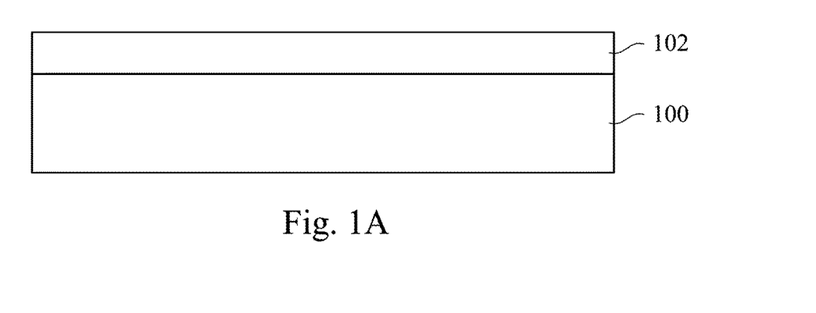
FIG. 1A to FIG. 1E are cross-sectional views illustrating the steps in a method for transferring at least one device according to one embodiment of the disclosure.

FIG. 1A to FIG. 1E are cross-sectional views illustrating the steps in a method for transferring devices 104 according to one embodiment of the disclosure. As shown in FIG. 1A, a pliable adhesive layer 102 is formed on a carrier substrate 100.

In this embodiment, the carrier substrate 100 is a rigid substrate. Specifically, the carrier substrate 100 is made of glass, silicon, polycarbonate (PC), acrylonitrile butadiene styrene (ABS), or any combinations thereof. Embodiments of this disclosure are not limited thereto.

In this embodiment, the pliable adhesive layer 102 is made of adhesion capable organic material. Specifically, the pliable adhesive layer 102 is made of epoxy, polymethylmethacrylate (PMMA), polysiloxanes, silicone, or any combinations thereof. Embodiments of this disclosure are not limited thereto.

The pliable adhesive layer 102 has a thickness in a range from about 1 µm to about 100 µm. The pliable adhesive layer 102 is coated by a spin coater, a slit coater, or any combinations thereof. Embodiments of this disclosure are not limited thereto.

Figure 1B:
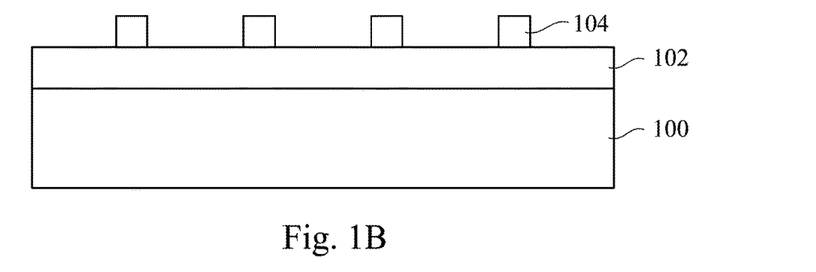

As shown in FIG. 1B, the devices 104 are placed over the pliable adhesive layer 102. Embodiments of this disclosure are not limited thereto. In some embodiments, there may be only one device 104 to be transferred.

In this embodiment, the devices 104 are light emitting diodes (LEDs). In some embodiments, the devices 104 are thin LEDs. The thickness of each of the devices 104 may be in a range from about 0.5 µm to about 100 µm. The size of each of the devices 104 may be in a range from about 0.5 µm to about 500 µm. In some embodiments, the devices 104 may be chips.

In some embodiments, the devices 104 may be formed on a growth substrate (not shown). Then, the devices 104 with the growth substrate are placed onto the pliable adhesive layer 102, such that the pliable adhesive layer 102 temporarily adheres the devices 104 thereto. Next, the growth substrate is removed from the devices 104 temporarily adhered to the pliable adhesive layer 102. In some embodiments, the removing is performed by laser lift-off, chemical lift-off, or any combinations thereof. Embodiments of this disclosure are not limited thereto. The removing may be performed by other methods.

Then, the adhesion pressure of the pliable adhesive layer 102 to each of the devices 104 is reduced while remaining the devices 104 respectively in a plurality of predictable positions on the pliable adhesive layer 102. In this embodiment, the pliable adhesive layer 102 is irradiated by an electromagnetic wave through the carrier substrate 100 to reduce the adhesion pressure of the pliable adhesive layer 102 to the devices 104. Embodiments of this disclosure are not limited thereto. In some embodiments, the reducing may be performed by an electric field, heat, ultrasound, mechanical force, pressure, or any combinations thereof.

In this embodiment, the reduced adhesion pressure of the pliable adhesive layer 102 is greater than ten times the weight of each of the devices 104, so that the devices 104 is respectively remained in the predictable positions on the pliable adhesive layer 102.

In this embodiment, the adhesion pressure of the pliable adhesive layer 102 to each of the devices 104 is in a range from about 0.01 Nt/25 mm to about 100 Nt/25 mm. In some embodiments, the adhesion pressure of the pliable adhesive layer 102 to each of the devices 104 is 20 Nt/25 mm, and the reduced adhesion pressure of the pliable adhesive layer 102 to each of the devices 104 is 0.5 Nt/25 mm.

The pliable adhesive layer 102 has a Young's modulus less than or equal to 30 GPa before and after the adhesion pressure of the pliable adhesive layer 102 is reduced. Embodiments of this disclosure are not limited thereto.

In this embodiment, the devices 104 are chipped devices. Embodiments of this disclosure are not limited thereto. In some embodiments, the devices 104 may be unchipped devices, and the devices 104 are chipped after the devices 104 are placed on the pliable adhesive layer 102 and before the adhesion pressure of the pliable adhesive layer 102 is reduced.

In some embodiments, the devices 104 may be chipped linearly, such that the shape of the devices 104 is a cube or a cuboid. The chipping may be performed by laser or other method. In some embodiments, the devices 104 may be chipped nonlinearly, such that the shape of the devices 104 is a pentagonal column, a hexagonal column, an octagonal column, a polygon column, or a cylindrical column.

In some embodiments, the chipping may be performed by inductively coupled plasma (ICP), wet etching, or other method. When the shape of the devices 104 is not a cuboid, the current leakage from the devices 104 is avoided. Therefore, light efficiency of the devices 104 is enhanced.

At least one process (for example, laser lift-off process or chip process) is performed on the devices 104 temporarily adhered to the pliable adhesive layer 102 before the adhesion pressure of the pliable adhesive layer 102 is reduced. Because of the adhesion pressure of the pliable adhesive layer 102 to each of the devices 104, the location of each of the devices 104 is remained in a predictable position on the pliable adhesive layer 102 during the process, or the relative locations of the devices 104 are remained in predictable positions on the pliable adhesive layer 102 during the process. In addition, the pliable adhesive layer 102 may function as a buffer layer to absorb external forces (for example, mechanical force).

Figure 1C:
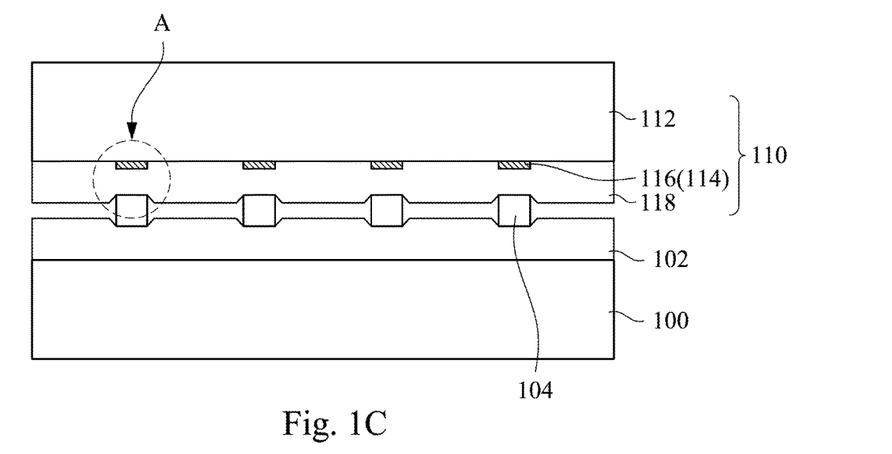

As shown in FIG. 1C, the devices 104 are contacted with a transfer head assembly 110, in which a pliable dielectric layer 118 of the transfer head assembly 110 is in contact with the devices 104 during the contacting. The pliable dielectric layer 118 of the transfer head assembly 110 is more pliable than the devices 104, such that the pliable dielectric layer 118 of the transfer head assembly 110 deforms during the contacting. Moreover, the pliable adhesive layer 102 is more pliable than the devices 104, such that the pliable adhesive layer 102 deforms during the contacting.

In this embodiment, the pliable dielectric layer 118 may include a polymer material, such as polymethylmethacrylate (PMMA), polysiloxanes, silicone, or combinations thereof. In some embodiments, the pliable dielectric layer 118 may be made of a composite polymer. The thickness of the pliable dielectric layer 118 may be in a range from about 0.05 μm to about 1 mm. Embodiments of this disclosure are not limited thereto.

In this embodiment, the pliable dielectric layer 118 has a Young's modulus less than or equal to 30 GPa. Embodiments of this disclosure are not limited thereto.

In this embodiment, the transfer head assembly 110 includes a base plate 112, transfer heads 114, and the pliable dielectric layer 118. Embodiments of this disclosure are not limited thereto. In some embodiments, the transfer head assembly 110 may include only one transfer head 114. The transfer heads 114 are located on the base plate 112. Each of the transfer heads 114 includes an electrode 116, and the electrode 116 is patterned on the base plate 112. In other words, the electrode 116 of each of the transfer head 114 is electrical unipolar. Embodiments of this disclosure are not limited thereto. In some embodiments, each of the transfer heads 114 may include a plurality of the electrodes 116 (the details will be described in subsequent embodiments). In this embodiment, the transfer head assembly 110 picks up the devices 104 by a Coulomb force, a Johnsen-Rahbek effect, or combinations thereof. In other words, in this embodiment, the grip force of the transfer head assembly 110 is an electrostatics force.

In this embodiment, as shown in FIG. 1C, when the transfer head assembly 110 is contacting the devices 104, at least one portion of the pliable dielectric layer 118 is between the electrodes 116 of the transfer head assembly 110 and the devices 104.

In this embodiment, the base plate 112 permits at least partial passage of visible light, infrared light, ultraviolet light, or combinations thereof. In this way, the transfer head assembly 110 can be positioned over the devices 104.

In this embodiment, the base plate 112 is made of quartz, silicon, glass, plastic, metal, ceramic, or combinations thereof. Embodiments of this disclosure are not limited thereto. The base plate 112 may be made of other materials.

Since the pliable dielectric layer 118 and the pliable adhesive layer 102 deform when the transfer head assembly 110 contacts the devices 104, the devices 104 are leveled with the transfer head assembly 110. In this way, the gap between the devices 104 and the transfer head assembly 110 can be eliminated, such that the devices 104 can be fully contacted with the transfer head assembly 110 to maintain the grip force of the transfer head assembly 110. Therefore, it makes the transfer head assembly 110 easier to pick up the devices 104, and increases the successful rate of picking up.

In addition, the impact forces of the transfer head assembly 110 on the devices 104 during the contacting can also be absorbed by the pliable dielectric layer 118 and the pliable adhesive layer 102, such that the devices 104 are not damaged by the transfer head assembly 110. Therefore, the process yield is increased.

Moreover, because of the adhesion pressure of the pliable adhesive layer 102, the location of each of the devices 104 temporarily adhered to the pliable adhesive layer 102 is remained in a predictable position during processes, such that the transfer heads 114 of the transfer head assembly 110 is easy to be positioned over the devices 104.

Please continue to refer to FIG. 1C. After the devices 104 are contacted with the transfer head assembly 110, the transfer head assembly 110 is actuated to create a grip force on the devices 104. In some embodiments, the devices 104 are contacted with the transfer head assembly 110 after the transfer head assembly 110 is actuated to create the grip force.

Figure 1D:
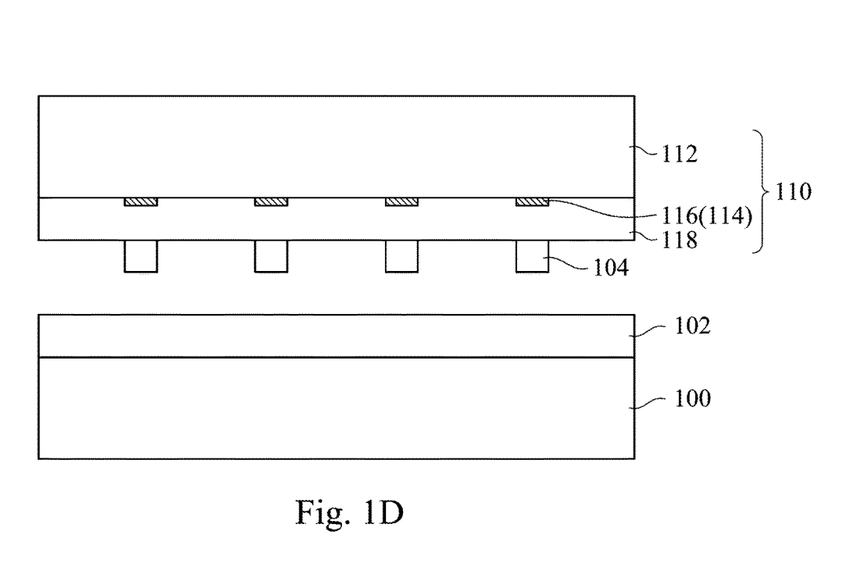

As shown in FIG. 1D, the devices 104 are picked up by the transfer head assembly 110. In the embodiment, the devices 104 are transferred to a receiving substrate 106. Embodiments of this disclosure are not limited thereto. In some embodiments, the devices 104 may be damaged devices, and the devices 104 are picked up and then abandoned.

In this embodiment, all of the devices 104 are picked up. Embodiments of this disclosure are not limited thereto. In some embodiments, only a part of the devices 104 are picked up.

Figure 1E:
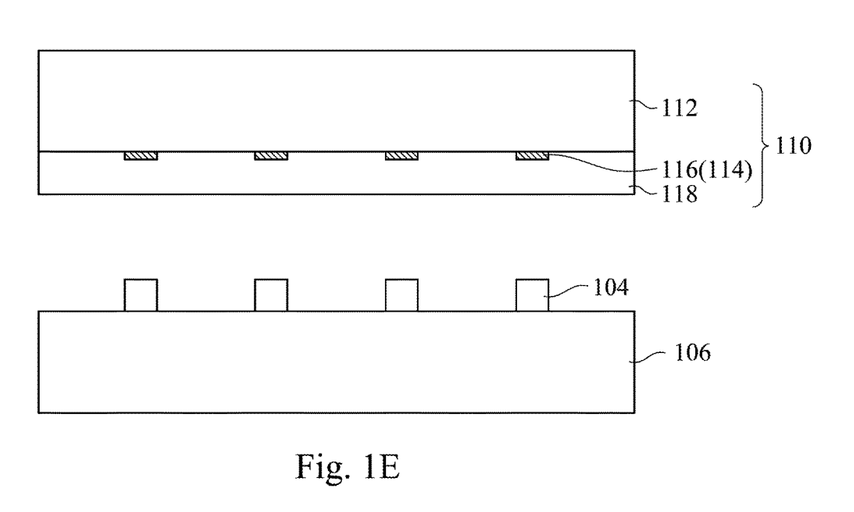

As shown in FIG. 1E, the devices 104 are placed onto the receiving substrate 106. In this embodiment, the devices 104 are respectively placed onto specific positions of the receiving substrate 106. Moreover, in this embodiment, the pliable dielectric layer 118 returns to its original shape before next picking up. In this way, the transfer head assembly 110 can be reusable.

In this embodiment, the receiving substrate 106 may be an active matrix display substrate or a passive matrix display substrate. Therefore, the receiving substrate 106 and the devices 104 form a display panel. Embodiments of this disclosure are not limited thereto. In some embodiments, the receiving substrate 106 and the devices 104 may form a lighting device.

Figure 2A:
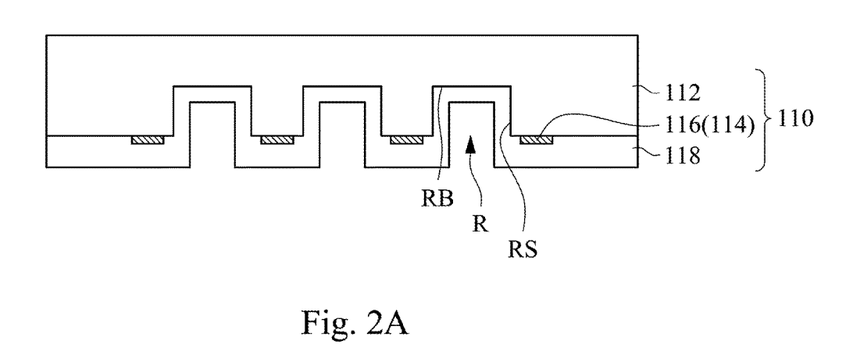
FIG. 2A is a cross-sectional view illustrating the transfer head assembly in FIG. 1A to FIG. 1E according to another embodiment of the disclosure.
Figure 2B:
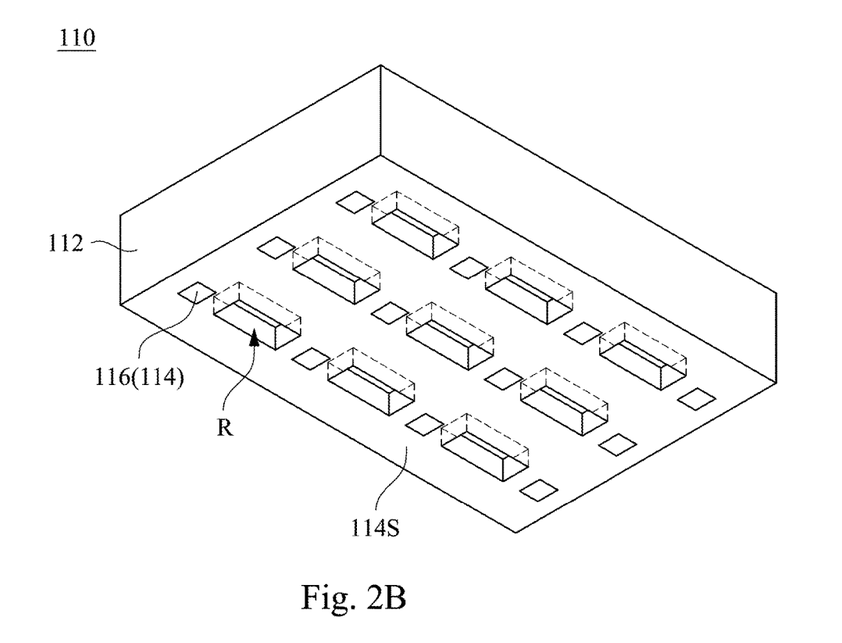
FIG. 2B is a perspective view illustrating the transfer head assembly in FIG. 2A, in which the pliable dielectric layer is omitted and thus not shown therein.

FIG. 2A is a cross-sectional view illustrating the transfer head assembly 110 in FIG. 1A to FIG. 1E according to another embodiment of the disclosure. FIG. 2B is a perspective view illustrating the transfer head assembly 110 in FIG. 2A, in which the pliable dielectric layer 118 is omitted and thus not shown therein. As shown in FIG. 2A, this embodiment is similar to the embodiment of FIG. 1A to FIG. 1E, and the differences between the two embodiments are that in this embodiment, the base plate 112 has recesses R therein, and the pliable dielectric layer 118 further conformally covers sidewalls RS and bottoms RB of the recesses R.

As shown in FIGS. 2A and 2B, in this embodiment, the recesses R are isolated from each other when viewing a side 114S of the transfer head assembly 110 where the devices 104 (not shown in FIGS. 2A and 2B) are intended to be gripped.

Figure 3:
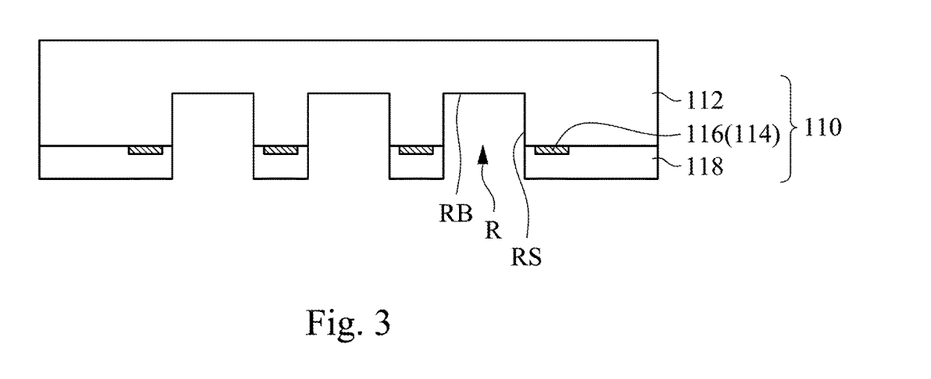
FIG. 3 is a cross-sectional view illustrating the transfer head assembly in FIG. 1A to FIG. 1E according to another embodiment of the disclosure.

FIG. 3 is a cross-sectional view illustrating the transfer head assembly 110 in FIG. 1A to FIG. 1E according to another embodiment of the disclosure. As shown in FIG. 3, this embodiment is similar to the embodiment of FIG. 2A, and the differences between the two embodiments are that in this embodiment, the sidewalls RS and the bottoms RB of the recesses R are free from coverage of the pliable dielectric layer 118.

Figure 4:
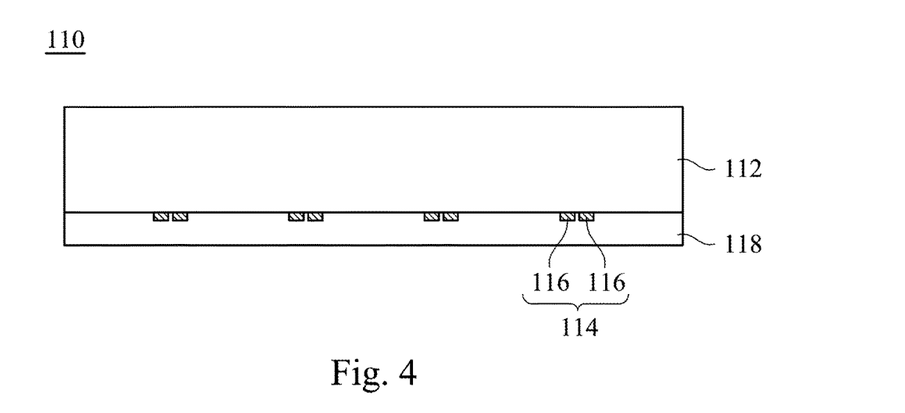
FIG. 4 is a cross-sectional view illustrating the transfer head assembly in FIG. 1A to FIG. 1E according to another embodiment of the disclosure.

FIG. 4 is a cross-sectional view illustrating the transfer head assembly 110 in FIG. 1A to FIG. 1E according to another embodiment of the disclosure. As shown in FIG. 4, this embodiment is similar to the embodiment of FIG. 1A to FIG. 1E, and the differences between the two embodiments are that in this embodiment, the number of the electrodes 116 of each of the transfer heads 114 is two. In other words, the electrodes 116 of each of the transfer head 114 is electrical bipolar.

Figure 5:
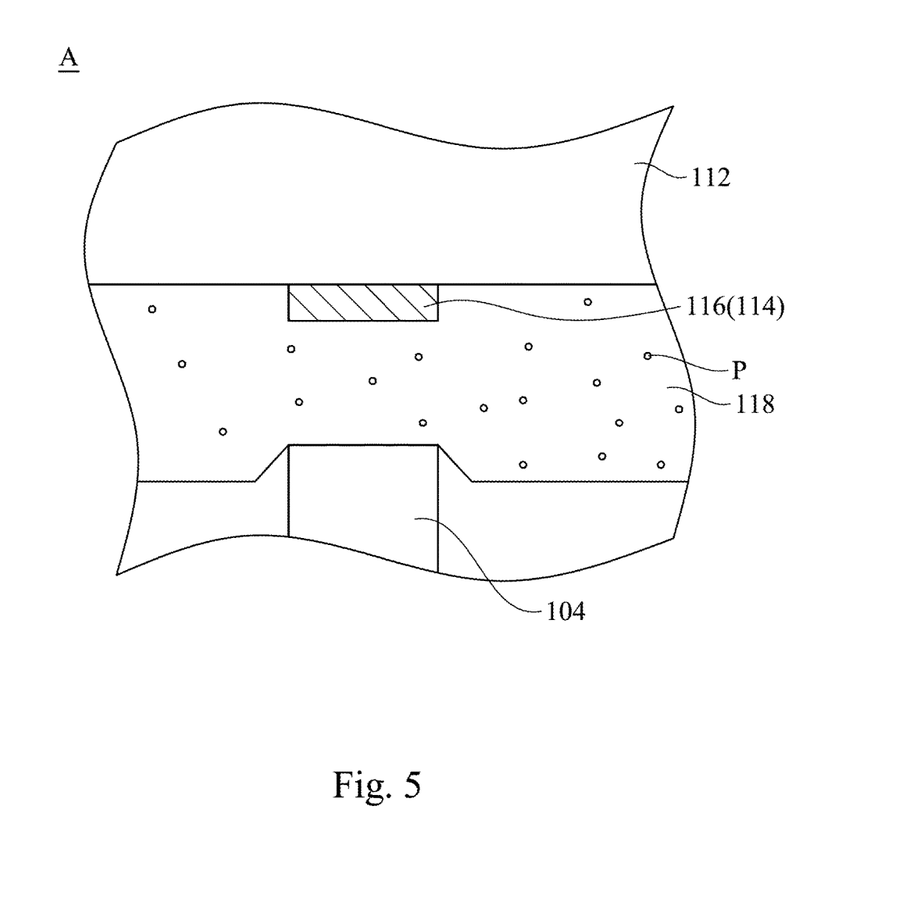
FIG. 5 is an enlarged view illustrating the A portion in FIG. 1C according to another embodiment of the disclosure.

FIG. 5 is an enlarged view illustrating the A portion in FIG. 1C according to another embodiment of the disclosure. This embodiment is similar to the embodiment of FIG. 1C, and the differences are elaborated hereinafter.

As shown in FIG. 5, in this embodiment, the pliable dielectric layer 118 further includes a plurality of particles P. That is, the pliable dielectric layer 118 is a composite dielectric layer. In some embodiments, the particles P are dispersed in the pliable dielectric layer 118. When the transfer head assembly 110 is contacting the device 104, at least a portion of the particles P is between the electrode 116 of the transfer head assembly 110 and the device 104.

In this embodiment, a dielectric constant of the particles P is greater than a dielectric constant of the pliable dielectric layer 118. In this embodiment, the particles include a high-k material, such as titanium dioxide ($TiO_2$), zirconium dioxide ($ZrO_2$), barium titanate ($BaTiO_3$), tantalum pentoxide ($Ta_2O_5$), hafnium dioxide ($HfO_2$), aluminum oxide ($Al_2O_3$), lanthanum oxide ($La_2O_3$), praseodymium oxide ($Pr_2O_3$), or combinations thereof. In this embodiment, the pliable dielectric layer 118 is more pliable than the particles P.

In this embodiment, the size of each of the particles P is less than or equal to one tenth of the size of the device 104. In this way, the pliable dielectric layer 118 can have a uniform thickness.

FIG. 6A to FIG. 6D are cross-sectional views illustrating some steps in a method for transferring devices 104 according to another embodiment of the disclosure. This embodiment is similar to the embodiment of FIG. 1A to FIG. 1E, and the differences are elaborated hereinafter.

Figure 6A:
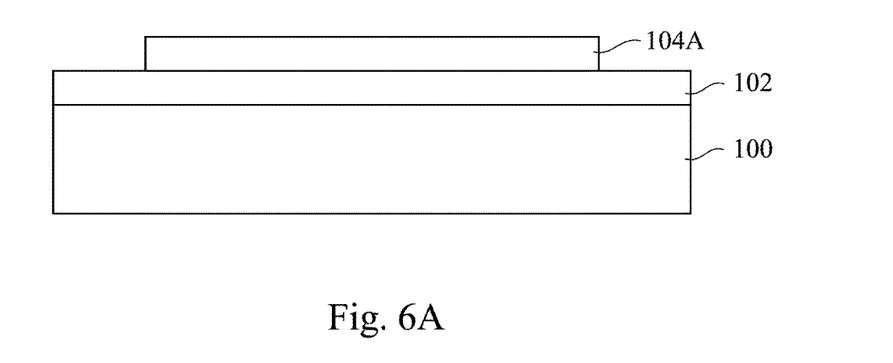
FIG. 6A to FIG. 6D are cross-sectional views illustrating some steps in a method for transferring at least one device according to another embodiment of the disclosure.
Figure 6B:
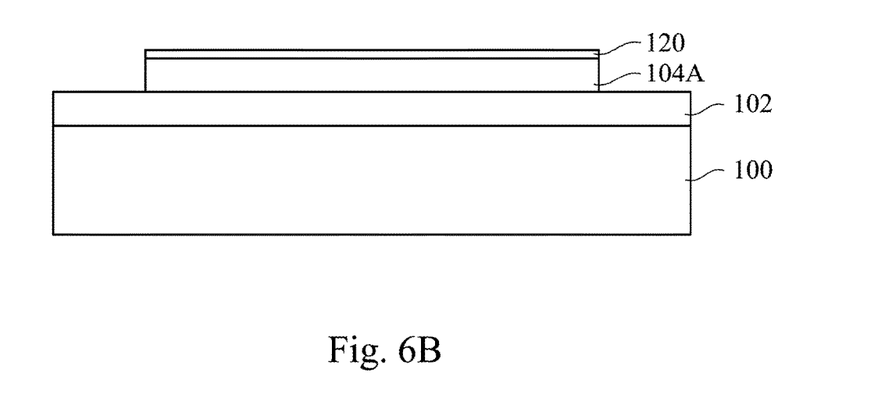
Figure 6C:
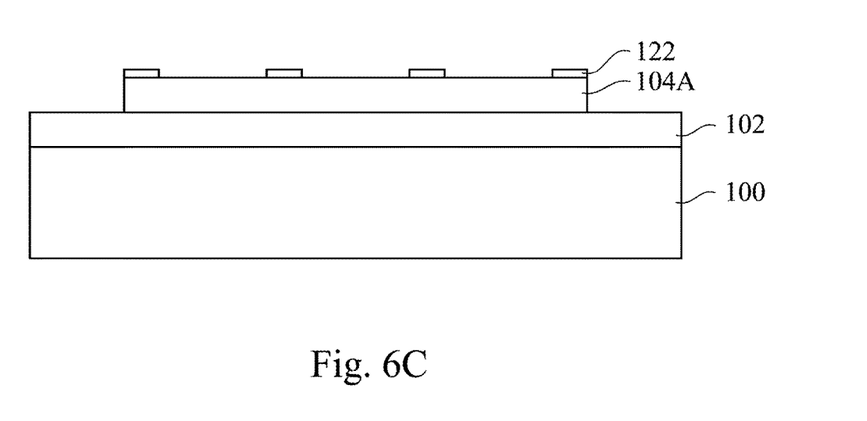
Figure 6D:
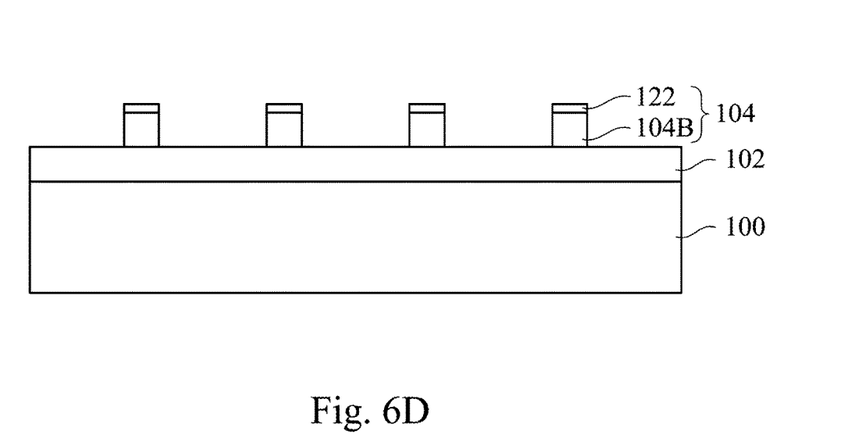

In this embodiment, as shown in FIG. 6D, each of the devices 104 formed over the pliable adhesive layer 102 is a chipped device 104B with a patterned photoresist layer 122 thereon, and the steps of forming the devices 104 over the pliable adhesive layer 102 in this embodiment will be described in FIG. 6A to FIG. 6D.

As shown in FIG. 6A, an unchipped device 104A is placed over the pliable adhesive layer 102. Similar to the embodiments described previously, the device 104A may be formed on a growth substrate (not shown). Then, the device 104A with the growth substrate are placed onto the pliable adhesive layer 102, such that the pliable adhesive layer 102 temporarily adheres the device 104A thereto. Next, the growth substrate is removed from the device 104A temporarily adhered to the pliable adhesive layer 102. In some embodiments, the removing is performed by laser lift-off, chemical lift-off, or any combinations thereof. Embodiments of this disclosure are not limited thereto. The removing may be performed by other methods.

As shown in FIG. 6B, a photoresist layer 120 is coated over the unchipped device 104A. In this embodiment, the photoresist layer 120 includes a polymer material. Embodiments of this disclosure are not limited thereto. In some embodiments, the photoresist layer 120 may include other materials.

As shown in FIG. 6C, the photoresist layer 120 is patterned. Consequently, a plurality of patterned photoresist layers 122 are formed over the unchipped device 104A.

As shown in FIG. 6D, the unchipped device 104A is etched through the patterned photoresist layer 122, such that the unchipped device 104A is chipped into the chipped devices 104B. In this embodiment, the etching may be performed by ICP, wet etching, or other method. Thereby, the plurality of devices 104 are formed over the pliable adhesive layer 102, in which each of the devices 104 formed over the pliable adhesive layer 102 is the chipped device 104B with the patterned photoresist layer 122 thereon.

According to the method for transferring devices provided in the disclosure, since the pliable dielectric layer and the pliable adhesive layer deform when the transfer head assembly contacts the devices, the devices are leveled with the transfer head assembly. In this way, the gap between the devices and the transfer head assembly can be eliminated, such that the devices can be fully contacted with the transfer head assembly to maintain the grip force of the transfer head assembly. Therefore, it makes the transfer head assembly easier to pick up the devices, and increases the successful rate of picking up.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for transferring a device, the method comprising:
    forming a pliable adhesive layer on a carrier substrate;
    placing the device over the pliable adhesive layer;
    contacting a transfer head assembly with the device, wherein a pliable dielectric layer of the transfer head assembly is in contact with the device during the contacting and more pliable than the device, the pliable adhesive layer is more pliable than the device, and the pliable dielectric layer comprises a plurality of particles;
    actuating the transfer head assembly to create a grip force;
    picking up the device by the grip force created by the transfer head assembly; and
    placing the device onto a receiving substrate.

2. The method of claim 1, wherein when the transfer head assembly is contacting the device, at least a portion of the pliable dielectric layer is between an electrode of the transfer head assembly and the device.

3. The method of claim 1, wherein the pliable dielectric layer returns to its original shape before next picking up.

4. The method of claim 1, wherein the transfer head assembly comprises:
    a base plate;
    a transfer head located on the base plate, wherein the transfer head comprises an electrode located on the base plate; and
    the pliable dielectric layer covering the electrode.

5. The method of claim 1, wherein the pliable dielectric layer comprises a polymer material.

6. The method of claim 1, wherein a dielectric constant of the particles is greater than a dielectric constant of the pliable dielectric layer.

7. The method of claim 1, wherein the particles comprise a high-k material.

8. The method of claim 1, wherein when the transfer head assembly is contacting the device, at least a portion of the particles is between an electrode of the transfer head assembly and the device.

9. The method of claim 1, further comprising:
    irradiating at least one electromagnetic wave to the pliable adhesive layer through the carrier substrate to reduce an adhesion pressure of the pliable adhesive layer to the device.

10. The method of claim 1, wherein the device placed over the pliable adhesive layer is a chipped device with a patterned photoresist layer thereon.

11. The method of claim 2, wherein the transfer head assembly picks up the device by a Coulomb force, a Johnsen-Rahbek effect, or combinations thereof.

12. The method of claim 4, wherein the base plate permits at least partial passage of visible light, infrared light, ultraviolet light, or combinations thereof.

13. The method of claim 4, wherein the base plate has at least one recess therein, and the pliable dielectric layer further conformally covers a sidewall and a bottom of the recess.

14. The method of claim 4, wherein the base plate has at least one recess therein, and a sidewall and a bottom of the recess are free from coverage of the pliable dielectric layer.

15. The method of claim 4, wherein the electrode of the transfer head is electrical unipolar.

16. The method of claim 4, wherein a pair of the electrodes of the transfer head is electrical bipolar.

17. The method of claim 13, wherein a number of the at least one recess is plural, and at least two of the recesses are isolated from each other when viewing a side of the transfer head assembly where said at least one device is intended to be gripped.

18. The method of claim 14, wherein a number of the at least one recess is plural, and at least two of the recesses are isolated from each other when viewing a side of the transfer head assembly where said at least one device is intended to be gripped.

19. The method of claim 10, wherein the placing the device over the pliable adhesive layer comprises:
    placing an unchipped device over the pliable adhesive layer;
    coating a photoresist layer over the unchipped device;
    patterning the photoresist layer; and
    etching the unchipped device through the patterned photoresist layer, such that the unchipped device is chipped into the chipped device.

* * * * *